United States Patent [19]
Erickson

[11] Patent Number: 5,891,756
[45] Date of Patent: Apr. 6, 1999

[54] PROCESS FOR CONVERTING A WIRE BOND PAD TO A FLIP CHIP SOLDER BUMP PAD AND PAD FORMED THEREBY

[75] Inventor: Curt A Erickson, Carmel, Ind.

[73] Assignee: Delco Electronics Corporation, Kokomo, Ind.

[21] Appl. No.: 883,694

[22] Filed: Jun. 27, 1997

[51] Int. Cl.$^6$ ............ H01L 21/44; H01L 21/48; H01L 21/50
[52] U.S. Cl. ............ 438/108; 438/106; 438/107; 438/612
[58] Field of Search .................. 438/108, 106, 438/107, 612

[56] References Cited

U.S. PATENT DOCUMENTS

| | | | |
|---|---|---|---|
| 4,950,623 | 8/1990 | Dishon | 438/615 |
| 5,137,845 | 8/1992 | Lochon et al. | 438/615 |
| 5,268,072 | 12/1993 | Agarwala et al. | 438/615 |
| 5,310,707 | 5/1994 | Kaussen et al. | 438/118 |
| 5,376,584 | 12/1994 | Agarwala | 438/615 |
| 5,542,174 | 8/1996 | Chiu | 438/615 |

*Primary Examiner*—Kevin M. Picardat
*Assistant Examiner*—Deven Collins
*Attorney, Agent, or Firm*—Jimmy L. Funke

[57] ABSTRACT

A method for forming a solder bump pad (22), and more particularly converting a wire bond pad (12) of a surface-mount IC device (10) to a flip chip solder bump pad (22), such that the IC device (10) can be flip-chip mounted to a substrate. The process generally entails an aluminum wire bond pad (12) on a substrate, with at least a portion of the wire bond pad (12) being exposed through a dielectric layer (16) on the substrate. A nickel layer (24) is then deposited on the portion of the wire bond pad (12) exposed through the dielectric layer (16). The nickel layer (24) is selectively deposited on the exposed portion of the wire bond pad (12) without use of a masking operation, such as by an electroless deposition technique. The nickel layer (24) completely overlies the aluminum wire bond pad (12), and therefore protects the bond pad (12) from oxidation due to exposure. Thereafter, the solder bump pad (22) is formed by depositing a solderable material on the nickel layer (24). The solder bump pad (22) is formed to cover only a limited portion of the nickel layer (24), and its shape is tailored to achieve the required geometric characteristics for a solder bump (26) subsequently formed on the solder bump pad (22).

16 Claims, 1 Drawing Sheet

5,891,756

PROCESS FOR CONVERTING A WIRE BOND PAD TO A FLIP CHIP SOLDER BUMP PAD AND PAD FORMED THEREBY

This invention was made with Government support under Agreement No. MDA972-95-3-0031 awarded by DARPA. The Government has certain rights in the invention.

FIELD OF THE INVENTION

The present invention generally relates to surface-mount integrated circuit devices. More particularly, this invention relates to surface-mount integrated circuit devices configured for electrical connection by wire bonding, and to a method by which wire bond pads on such a device are modified to yield flip chip solder bump pads that enable the device to be flip-chip mounted to a conductor pattern.

BACKGROUND OF THE INVENTION

A flip chip is generally a monolithic semiconductor device, such as an integrated circuit (IC), having bead-like terminals formed on one of its surfaces. The terminals, usually in the form of solder bumps, serve to both secure the flip chip to a circuit board and electrically interconnect the chip circuitry to a conductor pattern formed on the circuit board. Flip chip technology is compatible with a variety of circuit board types, including ceramic substrates, printed wiring boards, flexible circuits, and silicon substrates. The solder bumps are typically located at the perimeter of the flip chip on electrically conductive bond pads that are electrically interconnected with the circuitry on the flip chip. Due to the numerous functions typically performed by the microcircuitry of a flip chip, a relatively large number of solder bumps are often required. The size of a flip chip is typically on the order of about thirteen millimeters per side, resulting in the solder bumps being crowded along the perimeter of the flip chip. As a result, flip chip conductor patterns are typically composed of numerous individual conductors that are often spaced apart about 0.1 millimeter or less.

Flip chips are widely used in the electronics industry as a result of their compact size and their characteristic of being directly attached to substrates without additional packaging. Another process for directly attaching an IC device to a substrate is by the wire bonding process. Such an IC device has a number of bond pads that are wire bonded to bond pads of a complementary conductor pattern on the substrate to which the device is being attached. The bond pads on the IC device are typically aluminum or an aluminum-base alloy for various known processing and performance-related reasons. The wire is often gold, which will bond well with the aluminum bond pad if the bonding operation is properly performed.

Though wire-bonded ICs are widely used, flip chips are generally smaller, less expensive to mount, and more versatile, being suitable for a wider variety of electronic products than are chip-and-wire ICs. Consequently, there has evolved a demand for flip chip bumping and attachment of surface-mount devices that were originally designed for attachment by wire bonding. Several alternatives have been contemplated for this conversion process. One example is illustrated in FIGS. 1A through 1C, which show an IC device 10 on which a wire bond pad 12 has been formed. The bond pad 12 is conventionally formed of aluminum or an aluminum-base alloy, and is therefore susceptible to corrosion if left exposed. Consequently, a passivation layer 16 overlies the surface of the device 10, with a square-shaped opening 14 being formed in the passivation layer 16 to expose an interior region of the bond pad 12. However, the exposed region of the bond pad 12 is too large for forming a solder bump for flip-chip mounting the device 10. In particular, any attempt to form a solder bump on the exposed region of the bond pad 12 would yield a solder bump having inadequate height and a tendency to short with adjacent solder bumps.

Therefore, the process of FIGS. 1A–1C further entails depositing a second passivation layer 18 on the bond pad 12 and the original passivation layer 16, and then developing a circular-shaped opening 20 in the second passivation layer 18, as shown in FIG. 1B. This step generally can be performed by spinning an organic dielectric material on the substrate 10, photolithographically developing the opening 20 using known methods, and then curing the dielectric material. The opening 20 shown in FIG. 1B is sized and shaped to enable the deposition of a controlled amount of solderable material 22 on that portion of the bond pad 12 re-exposed by the opening 20, the result of which is illustrated in FIG. 1C. The solderable material 22 forms a bond pad that enables solder to be deposited and reflowed to form a suitable solder bump (not shown).

Though the process represented in FIG. 1A through 1C yields a suitable bond pad for a flip chip solder bump, the requirement for an additional passivation layer 18 and a masking operation to form the opening 20 represent a significant impact on processing costs and scheduling.

In view of the above, it would be desirable if a process were available that enabled wire bond pads to be converted to flip chip solder bump pads, but that avoided the cost and processing disadvantages of additional masking operations.

SUMMARY OF THE INVENTION

It is an object of this invention to provide a method for converting an aluminum wire bond pad to a flip chip solder bump pad, so as to enable an IC device originally configured for wire-bonding attachment to be mounted using a flip chip attachment technique.

It is a further object of this invention that such a method does not entail an additional masking operation.

It is another object of this invention that such a method yields a bond pad structure that protects the original aluminum wire bond pad.

In accordance with a preferred embodiment of this invention, these and other objects and advantages are accomplished as follows.

According to the present invention, there is provided a method for forming a solder bump pad, and more particularly converting a wire bond pad of a surface-mount IC device to a flip chip solder bump pad, such that the IC device can be flip-chip mounted to a substrate. As such, the process of this invention generally entails an aluminum wire bond pad on a substrate, with at least a portion of the wire bond pad being exposed through a dielectric layer on the substrate. A nickel layer is then deposited on the portion of the wire bond pad exposed through the dielectric layer. The nickel layer is selectively deposited on the exposed portion of the wire bond pad without use of a masking operation, such as by an electroless deposition technique. The nickel layer completely overlies the aluminum wire bond pad, and therefore protects the bond pad from oxidation due to exposure. Thereafter, a solderable material is deposited on the nickel layer, such that the solderable material forms the solder bump pad. The solder bump pad is formed to cover only a limited portion of the nickel layer, and its shape is tailored to achieve the required geometric characteristics for a solder bump subsequently formed thereon.

As described above, the process of this invention yields a flip chip solder bump pad from a wire bond pad without requiring an additional passivation layer or masking operation to properly size and shape the solder bump pad. Accordingly, this invention avoids the significant impact on processing costs and scheduling that these additional steps would incur, while achieving the accuracy and integrity required for flip chip bonding techniques.

Other objects and advantages of this invention will be better appreciated from the following detailed description.

BRIEF DESCRIPTION OF THE DRAWINGS

The present invention will now be described, by way of example, with reference to the accompanying drawings, in which.

DETAILED DESCRIPTION OF THE INVENTION

Figure 1A:
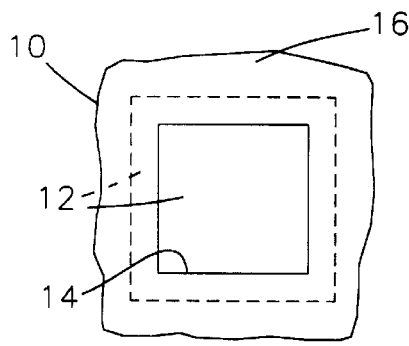
FIGS. 1A–1C are plan views illustrating processing steps performed to convert a wire bond pad to a flip chip solder bump pad in accordance with the prior art.
Figure 1B:
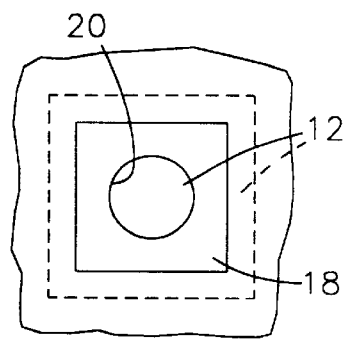
Figure 1C:
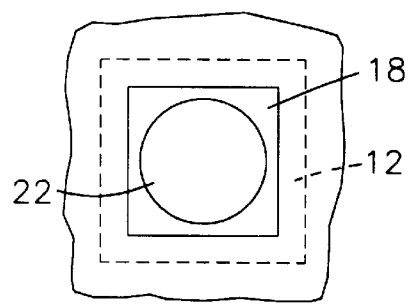
Figure 2A:
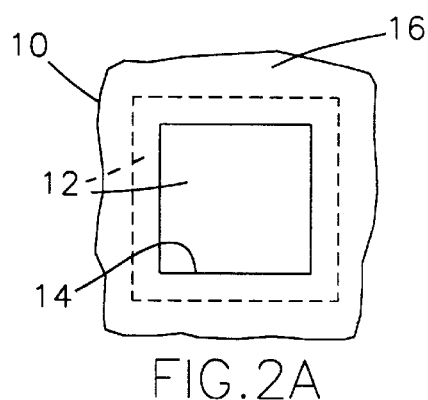
FIGS. 2A–2C are plan views illustrating processing steps performed to convert a wire bond pad to a flip chip solder bump pad in accordance with the present invention.
Figure 2B:
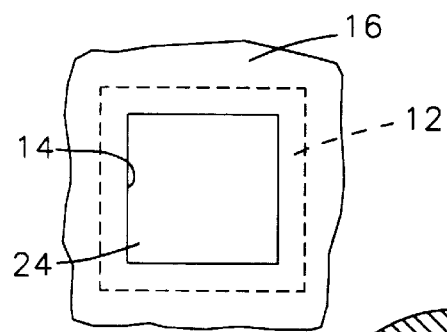
Figure 2C:
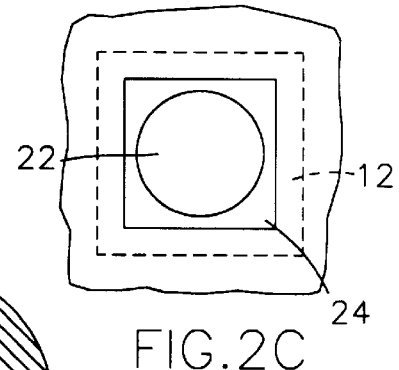

Illustrated in FIGS. 2A through 2C is a process for converting a wire bond pad 12 (FIG. 2A) to a flip chip solder bump pad 22 (FIG. 2C), such that a wire bond IC device can be modified to yield a flip chip IC device. IC devices modified according to this invention achieve the processing and performance benefits associated with flip chip IC devices, while incurring minimal additional processing and material costs.

As represented in FIG. 2A, an IC device 10 originally configured to be wire bonded to a substrate (not shown) is illustrated as having an aluminum wire bond pad 12 exposed through a square-shaped opening 14 formed in a passivation layer 16 that overlies the surface of the device 10. As is conventional, the passivation layer 16 is formed by a thin layer of a suitable dielectric material, such as silicon dioxide, and serves to protect the underlying surface from moisture and electrical shorts. The first processing step of this invention is to deposit a nickel layer 24 on the exposed region of the bond pad 12, the result of which is represented by FIG. 2B. Deposition of the nickel layer 24 can be performed electrolessly, such that nickel is deposited only on the aluminum wire bond pad 12 without the use of a masking operation. Using an electroless process known in the art, the nickel completely covers, and therefore fully protects, the underlying aluminum of the bond pad 12. As such, the process of this invention entails using a layer of nickel to perform the traditional function of a passivation layer in IC technology. The nickel layer 24 also maintains electrical accessibility to the wire bond pad 12, such than an access via through the nickel layer 24 to the bond pad 12 is unnecessary.

As shown in FIG. 2C, processing continues by depositing a solderable material on the nickel layer 24 to form the flip chip solder bump pad 22. The pad 22 is deposited to be properly sized and shaped to enable the formation of a suitable solder bump (26 in FIG. 3) using known solder bumping reflow techniques. As shown in FIG. 2C, the pad 22 of solderable material has a circular shape that lies entirely on the square-shaped nickel layer 24 and entirely within the square-shaped opening 14 in the passivation layer 16. The solderable material is selected to promote a metallurgically bond with the solder bump 26, thereby providing a reliable mechanical and electrical connection between the IC device 10 and a conductor bond pad (not shown) formed on the substrate to which the IC device 10 is to be flip-chip mounted.

Various compositions could be used for the solderable material that forms the solder bump pad 22 of the present invention. A preferred metallurgy is a multilayer metal structure, with a bottom layer of aluminum deposited directly on the electroless nickel layer 24, followed by a layer of a nickel-vanadium alloy and then a copper layer. A preferred process for depositing the layers of the multilayer bond pad 22 is sputtering, though it is foreseeable that other deposition processes could be employed. The copper layer of the bond pad 22 is readily solderable, i.e., can be wetted by and will metallurgically bond with solder alloys of the type used for solder bumps. As such, the copper layer promotes the formation of the solder bump 26 with known bumping techniques. The solder alloy for the solder bump 26 can be deposited on the bond pad 22 as a solder paste or by known electroplating or evaporation techniques, and upon reflow forms the solder bump 26 as shown in FIG. 3.

Figure 3:
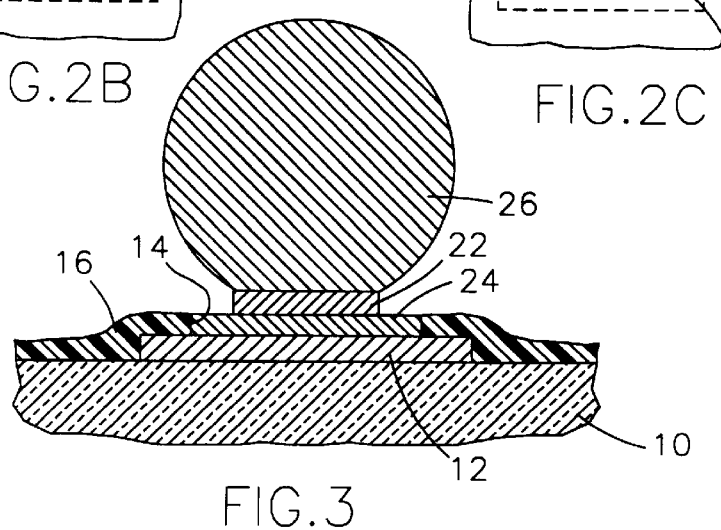
FIG. 3 is a cross sectional view of the flip chip solder bump pad of FIG. 2C.

FIG. 3 represents a cross-sectional view of the resulting bumped pad structure of this invention. The solder bump 26 has a spherical shape due to the reflow process by which the solder material is heated above its liquidus temperature, at which the solder material coalesces to form a bump or ball, and then cooled so as to metallurgically bond the solder bump 26 to the bond pad 22.

While the invention has been described in terms of a preferred embodiment, it is apparent that other forms could be adopted by one skilled in the art. For example, other bond pad metallurgies could be substituted for the multilayer structure disclosed. Accordingly, the scope of the invention is to be limited only by the following claims.

What is claimed is:

1. A method for forming a solder bump pad, the method comprising the steps of:

providing an aluminum pad on a substrate, at least a portion of the aluminum pad being exposed through a dielectric layer on the substrate;

depositing a nickel layer on the portion of the aluminum pad exposed through the dielectric layer, the nickel layer being deposited so as not to cover the dielectric layer; and then depositing a solderable material on the nickel layer so as to form the solder bump pad.

2. A method as recited in claim 1, wherein the dielectric layer is a passivation layer.

3. A method as recited in claim 1, wherein the step of depositing the nickel layer entails an electroless deposition process.

4. A method as recited in claim 1, wherein the step of depositing the solderable material entails a sputtering process.

5. A method as recited in claim 1, wherein the solder bump pad comprises multiple metal layers.

6. A method as recited in claim 5, wherein the multiple metal layers comprise an aluminum layer deposited on and contacting the nickel layer.

7. A method as recited in claim 5, wherein the multiple metal layers comprise a copper layer that is a top solderable layer of the multiple metal layers.

8. A method as recited in claim 5, wherein the multiple metal layers comprise an aluminum layer deposited on and contacting the nickel layer and a copper layer that is a top solderable layer of the multiple metal layers.

9. A method as recited in claim 1, wherein the aluminum pad has a square shape.

10. A method as recited in claim 1, wherein the portion of the aluminum pad is exposed through an opening in the dielectric layer, the nickel layer is deposited to completely cover the portion of the aluminum pad exposed by the opening such that the nickel layer has a perimeter defined by the opening, and the solderable material is deposited on the nickel layer such that the solder bump pad has a circular shape and lies entirely within the perimeter of the nickel layer.

11. A method as recited in claim 1, wherein the solder bump pad covers a limited portion of the nickel layer so that at least a portion of the nickel layer remains exposed.

12. A method for forming a flip chip solder bump pad, the method comprising the steps of:

provinding an aluminum wire bond pad on a substrate of a surface-mount electronic device, at least a portion of the wire bond pad being exposed through a passivation layer on the substrate;

electrolessly plating a nickel layer on the portion of the wire bond pad exposed through the passivation layer, such that the wire bond pad is completely covered by the nickel layer and the passivation layer and such that the nickel layer does not cover any portion of the passivation layer;

depositing a multilayer structure on a limited portion of the nickel layer so that at least a portion of the nickel layer remains exposed, the multilayer structure comprising a solderable material as a top layer of the multilayer structure; and then forming a solder bump on the top layer of the multilayer structure.

13. A method as recited in claim 12, wherein the step of depositing the multilayer structure entails a sputtering process.

14. A method as recited in claim 12, wherein the multilayer structure comprises an aluminum layer deposited on and contacting the nickel layer.

15. A method as recited in claim 12, wherein the solderable material is copper.

16. A method as recited in claim 12, wherein the multilayer structure comprises an aluminum layer deposited on and contacting the nickel layer, a copper layer that is a top layer of the multilayer structure, and a nickel-vanadium layer between the aluminum and copper layers.

* * * * *